(12) United States Patent
Rajakarunanayake

(10) Patent No.: US 8,201,057 B2
(45) Date of Patent: Jun. 12, 2012

(54) SYSTEM AND METHOD FOR INTER-PACKET CHANNEL CODING AND DECODING

(75) Inventor: Yasantha N. Rajakarunanayake, San Ramon, CA (US)

(73) Assignee: Broadcom Corporation, Irvine, CA (US)

( * ) Notice: Subject to any disclaimer, the term of this patent is extended or adjusted under 35 U.S.C. 154(b) by 909 days.

(21) Appl. No.: 12/285,929

(22) Filed: Oct. 16, 2008

(65) Prior Publication Data

US 2009/0300469 A1    Dec. 3, 2009

Related U.S. Application Data

(60) Provisional application No. 61/071,991, filed on May 29, 2008.

(51) Int. Cl.
*H03M 13/00* (2006.01)
(52) U.S. Cl. ........................................ 714/776
(58) Field of Classification Search .................. 714/776, 714/786
See application file for complete search history.

(56) References Cited

U.S. PATENT DOCUMENTS

| | | | | |
|---|---|---|---|---|
| 7,216,282 | B2 * | 5/2007 | Cain | 714/752 |
| 7,464,319 | B2 * | 12/2008 | Budge et al. | 714/762 |
| 7,522,528 | B2 * | 4/2009 | Fellman et al. | 370/236 |
| 7,539,187 | B2 * | 5/2009 | Fellman et al. | 370/389 |
| 7,739,574 | B2 * | 6/2010 | Kang et al. | 714/746 |
| 7,797,607 | B2 * | 9/2010 | Choi et al. | 714/752 |
| 7,917,833 | B2 * | 3/2011 | Mizuochi et al. | 714/776 |

* cited by examiner

*Primary Examiner* — James C Kerveros
(74) *Attorney, Agent, or Firm* — Sterne, Kessler, Goldstein & Fox P.L.L.C.

(57) ABSTRACT

A system and method for inter-packet channel encoding/decoding for recovering lost packets, while minimizing network latency and delay. The novel inter-packet channel encoding/decoding scheme described herein operates on a running-basis. This running-basis scheme advantageously allows for a large number of packet losses to be corrected at a receiving node.

38 Claims, 10 Drawing Sheets

Packets included in FEC payload calculation

Packets excluded from FEC payload calculation

SYSTEM AND METHOD FOR INTER-PACKET CHANNEL CODING AND DECODING

CROSS REFERENCE TO RELATED APPLICATIONS

The present application claims the benefit of U.S. Provisional Patent Appl. No. 61/071,991, filed May 29, 2008, entitled "System and Method for Inter-Packet Channel Coding and Decoding," which is incorporated herein by reference in its entirety.

FIELD OF THE INVENTION

The invention pertains in general to error handling in communications systems and more particularly to systems and methods for inter-packet channel coding and decoding in communications systems.

BACKGROUND

The Internet Protocol (IP) is one of the most commonly used network layer protocols for communicating data across a packet-switched network. The popularity of IP may be attributed to several factors, including its ability to effectively communicate data for a wide variety of applications. In more recent years, IP has become widely used for real-time multimedia applications, such as digital video delivery. A system capable of receiving and displaying an IP encoded stream of video packets may be generically referred to as an Internet Protocol Television (IPTV). Service providers of IPTV networks generally guarantee a high level of reliability in the access and core networks, where, for example, fiber, DSL and cable technologies provide a reliable, error free packet stream to subscribers.

Recently, with the advent of higher speed capabilities in wireless networks, local distribution of real-time multimedia applications over wireless networks has become a desired, and sometimes preferable technique. For example, wireless in-home video distribution is frequently desired for distributing an IPTV data stream. At the same time, however, packet loss that is inherent in wireless networks often provides a less than optimal physical environment for the distribution of IPTV streams.

Since packet loss is inevitable in a wireless network environment, error mitigation schemes have been introduced to overcome the effects of lost packets. For example, many wireless based networks, such as an IEEE 802.11 wireless local area network (LAN), include a MAC level retransmission scheme; if the receiver has not acknowledged the successful receipt of a packet, the sender will retry the transmission of the packet. Even though MAC level retransmissions on a link-by-link basis are available, intolerable retransmission delays and latencies are often introduced using these schemes, degrading playback quality of delay sensitive content, such as video.

Therefore, what is needed is a system and method for recovering lost packets, while minimizing network latency and delay.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

1. Introduction

The present invention is directed to systems and methods for inter-packet channel coding and decoding in communications systems. In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

2. Exemplary Network Environment

Figure 1:
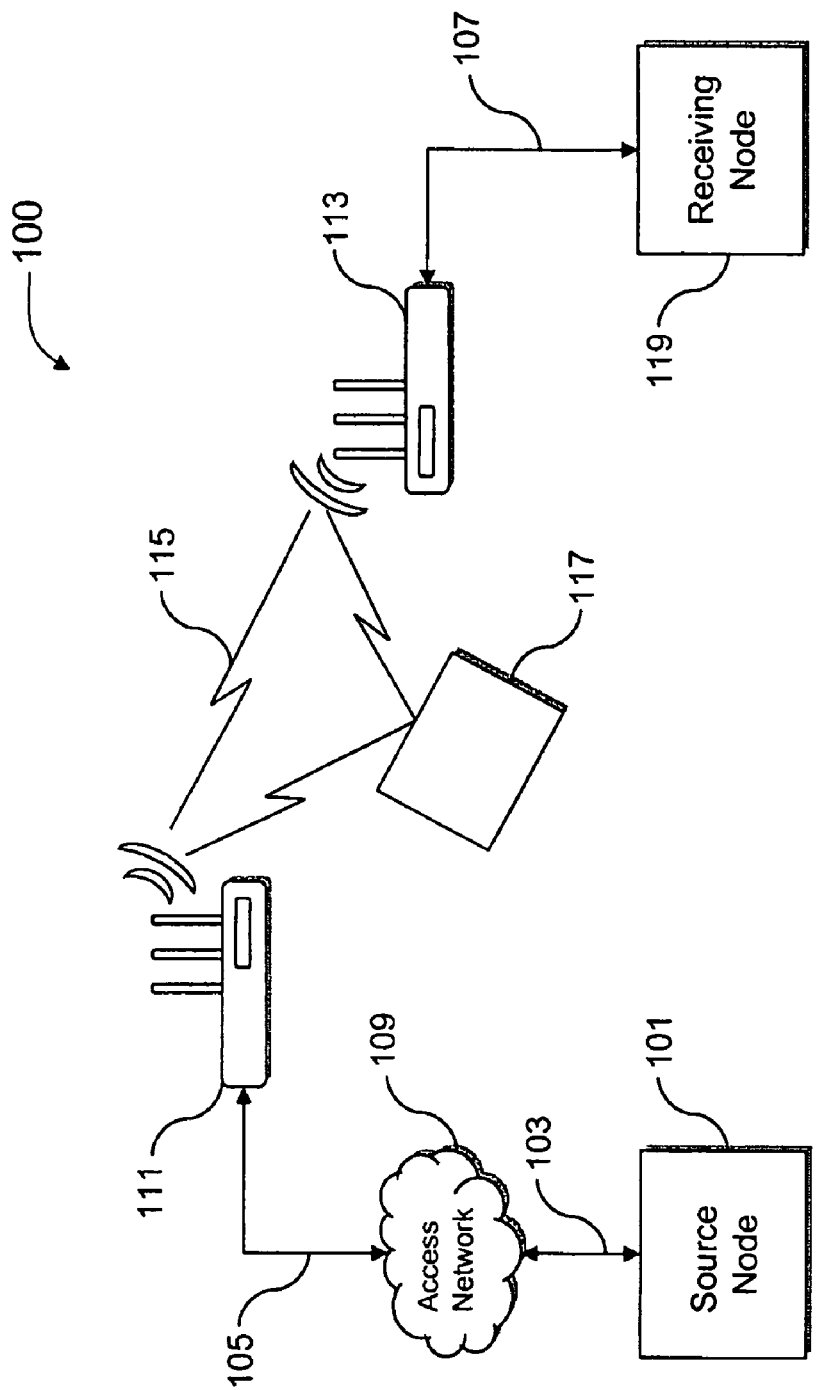
FIG. 1 illustrates an exemplary network environment, according to an embodiment of the present invention.

FIG. 1 illustrates an exemplary network environment 100, according to an embodiment of the present invention. In practical application, exemplary network environment 100 may include any kind of public or private space which is designed for wireless network access. Such environments may comprise, for example and without limitation, offices, airports, train stations, factories, internet cafés, any outdoor environment configured for wireless capabilities (such as any outdoor environment providing cellular phone support), and similar environments.

Exemplary network environment 100 includes source node 101, network links 103, 105 and 107, access network 109, access point 111, wireless station 113, wireless link 115, obstacle 117 and receiving node 119. Source node 101 is configured to communicate with access point 111 over access network 109. Access point 111 is configured to communicate with wireless station 113 over wireless link 115. Access point 111, wireless station 113, and wireless link 115 form a wireless LAN.

Source node 101 is any device capable of communicating with access point 111 over access network 109. Source node 101 may communicate with access point 111 through unicast or multicast transmission. Source node 101 may comprise, for example, a personal computer, a server, or video distribution service. In an embodiment, source node 101 comprises an IPTV video server that transmits an IPTV stream to access point 111 through access network 109. Service providers of IPTV networks generally guarantee a high level of reliability in the access networks, such as access network 109, where, for example, fiber, DSL and cable technologies provide a reliable, error free packet stream to subscribers.

Access point 111 is configured to receive the IPTV stream from source node 101 and distribute the IPTV stream to one or more wireless stations 113. Although FIG. 1 illustrates a single wireless station 113 coupled to receiving node 119, one or more wireless stations 113 may be capable of receiving the IPTV stream transmitted by access point 111. In an embodiment, when one or more wireless stations 113 exist within the LAN, access point 111 may transmit the IPTV stream simultaneously to all, or a group of wireless stations 113 as a multicast transmission. Alternatively, the IPTV stream may be transmitted sequentially as one or more unicast transmissions to one or more wireless stations 113.

Access point 111 comprises any device that may be used as a bridge between network link 105 and wireless link 115. In an embodiment, access point 111 communicates with source node 101 through network link 105 according to the IEEE 802.3 standard (i.e., Ethernet). In a further embodiment, access point 111 adheres to the IEEE 802.11 wireless standard (e.g., 802.11a, 802.11b, 802.11g, and/or 802.11n) to communicate with wireless station 113 through wireless link 115. It will be understood by one skilled in the relevant art(s) that access point 111 may adhere to other wired and wireless standards without departing from the scope of the present invention.

As described further herein, wireless station 113 may comprise any device capable of receiving transmissions from source node 101 via access point 111. In an embodiment, wireless station 113 may comprise a TV set-top box configured to receive an IPTV stream provided by source node 101. In general, wireless station 113 comprises any device that may be used as a bridge between wireless link 115 and network link 107. In an embodiment, wireless station 113 adheres to the IEEE 802.11 wireless standard (e.g., 802.11a, 802.11b, 802.11g, and/or 802.11n) to communicate with access point 111. However, it will be understood by one skilled in the relevant art(s) that wireless station 113 may adhere to other wireless standards without departing from the scope of the present invention.

Receiving node 119 may be any device capable of receiving and displaying an IPTV stream. Receiving node 119 may receive an IPTV stream from wireless station 113 through network link 107. In an embodiment, receiving node 119 and wireless station 113 communicate over network link 107 according to the IEEE 802.3 standard (i.e., Ethernet). However, it will be understood by one skilled in the relevant art(s) that receiving node 119 and wireless station 113 may communicate via other communication standards without departing from the scope of the present invention. In addition, it should be noted that wireless station 113, although shown separate from receiving node 119, may be implemented within receiving node 119 to form a single device.

Wireless local distribution of an IPTV stream, as illustrated in FIG. 1, presents significant challenges. The physical environment of a wireless network inherently leads to packet loss at a wireless receiver. Packet loss within a wireless network, such as the wireless LAN illustrated in FIG. 1, can occur due to many reasons, including congestion from other wireless devices communicating within the same frequency band, interference from other devices such as microwaves, and as a result of multipath propagation. Multipath propagation is a propagation phenomenon that results in radio signals reaching a receive antenna by two or more paths. Potential causes of multipath include, but are not limited to, atmospheric ducting, ionospheric reflection and/or refraction, and/or reflection from terrestrial objects (e.g., mountains, buildings, etc.). FIG. 1 illustrates the concept of multipath propagation. As shown in FIG. 1, a radio signal transmitted from access point 111 disperses through the physical channel (i.e., wireless link 115) and is partially reflected off of obstacle 117. The transmitted signal, as well as the reflected portion of the transmitted signal, both reach the receive antenna of wireless station 113, resulting in interference commonly referred to as multipath fading. Packets within a wireless network may be subsequently lost as a result of multipath propagation and to other forms of interference and congestion, as mentioned briefly above.

Since packet loss is inevitable in a wireless network environment, error mitigation schemes have been introduced to overcome the effects of lost packets. For example, many wireless based network standards, such as IEEE's 802.11 standards, include a MAC level retransmission scheme; if the receiver has not acknowledged the successful receipt of a packet, the sender will retry the transmission of the packet. Even though retransmissions on a link-by-link basis are available, intolerable retransmission delays and latencies are often introduced using these schemes, degrading playback quality of delay sensitive content, such as video. Furthermore, currently deployed forward error correction (FEC) algorithms, such as Reed Solomon, add significant overhead and are inefficient for real-time data transmissions, such as IPTV. These FEC algorithms have unnecessary complexity since they operate under the assumption of a non-erasure channel. However, the position of a packet loss within real-time multimedia transmissions, such as an IPTV stream, in most instances, may be inferred. This type of channel, where it is clear which packets are lost, is commonly referred to as an erasure channel and greatly simplifies the implementation of many FEC algorithms.

The present invention is primarily directed to a system and method for inter-packet channel encoding/decoding for recovering lost packets, while minimizing network latency and delay. The following sections provide a description of the novel inter-packet channel encoding/decoding scheme within the specific embodiment of an IEEE 802.11 LAN network. It will be understood by one skilled in the relevant art(s) that the present invention may be used within other types of wireless networks without departing from the scope of the present invention. In addition, for exemplary purposes, the novel inter-packet channel encoding/decoding scheme of the present invention will be described within the context of exemplary network environment 100, as illustrated in FIG. 1. It will be understood by one skilled in the relevant art(s), however, that the novel inter-packet channel encoding/decoding scheme of the present invention may be applied within other network environments without departing from the scope of the present invention. It will be further understood by one skilled in the relevant art(s) that the novel inter-packet channel encoding/decoding scheme of the present invention may be used in conjunction with other real-time multimedia applications, other than IPTV, without departing from the scope of the present invention.

3. Inter-Packet Channel Encoding

Figure 2:
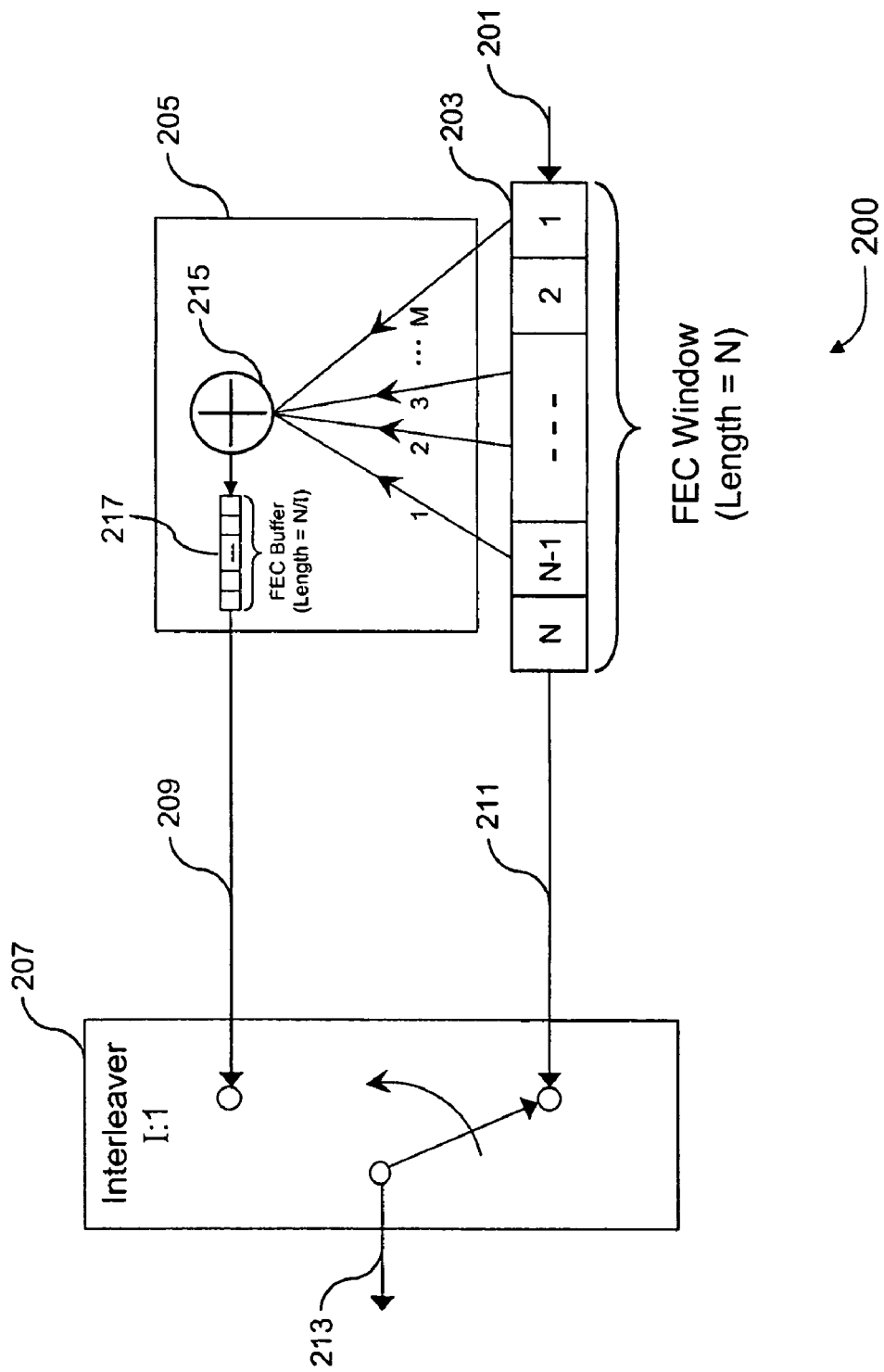
FIG. 2 illustrates an exemplary block diagram of a running-basis parity check encoder for encoding a stream of data packets destined for transmission over a packet-based network, according to embodiments of the present invention.

FIG. 2 illustrates an exemplary block diagram of a running-basis parity check encoder 200 for encoding a stream of frames 201 destined for transmission over a packet-based network, according to an embodiment of the present invention. Running-basis parity check encoder 200 may be implemented in hardware, software or any combination thereof In an embodiment, running-basis parity check encoder 200 may be implemented within access point 111 of FIG. 1. Ethernet frames received over network link 105, carrying IP video packets, may be encoded by running-basis parity check encoder 200 before being transmitted over wireless link 115. The IPTV stream encoded by running-basis parity check encoder 200 allows for lost packets among a stream of packets (i.e., inter-packet) received at wireless station 113 to be recovered. Running-basis parity check encoder 200 includes frame buffer 203, FEC packet generator 205, and interleaver 207. Frame buffer 203, in an embodiment has a frame buffer length of N frames, and receives a stream of Ethernet frames 201 from an IPTV source node, such as source node 101 of FIG. 1.

As illustrated in FIG. 2, a subset of M Ethernet frames are selected from N Ethernet frames stored within frame buffer 203. FEC packet generator 205 performs the bitwise XOR 215 of the M selected Ethernet frames to generate a FEC payload 209. Interleaver 207 creates an encoded stream 213 comprising Ethernet frames 211 and FEC payloads 209. The encoded stream 213 may subsequently be encapsulated and transmitted according to a wireless standard, such as the IEEE 802.11 standard. Interleaver 207 as illustrated in FIG. 2, interleaves a single FEC payload 209 for every I Ethernet frames 211, where I is less than N. Consequently, each Ethernet frame 211, contained within frame buffer 203, may influence more than one FEC payload 209. As a result, FEC payloads 209 represent a running-basis parity check, similar to convolution based encoders. In fact, in certain implementations of running-basis parity check encoder 200 a single Ethernet frame may influence up to M FEC payloads 209. It should be further noted that FEC packet generator may include an additional FEC buffer 217 of length N/I, where N is the FEC window length and I is the interleave factor. FEC buffer 217 acts as a delay to ensure that FEC payloads 209 are interleaved at the appropriate position within Ethernet frames 211. A single FEC payload 209 is generated for every I Ethernet frames.

Figure 3:
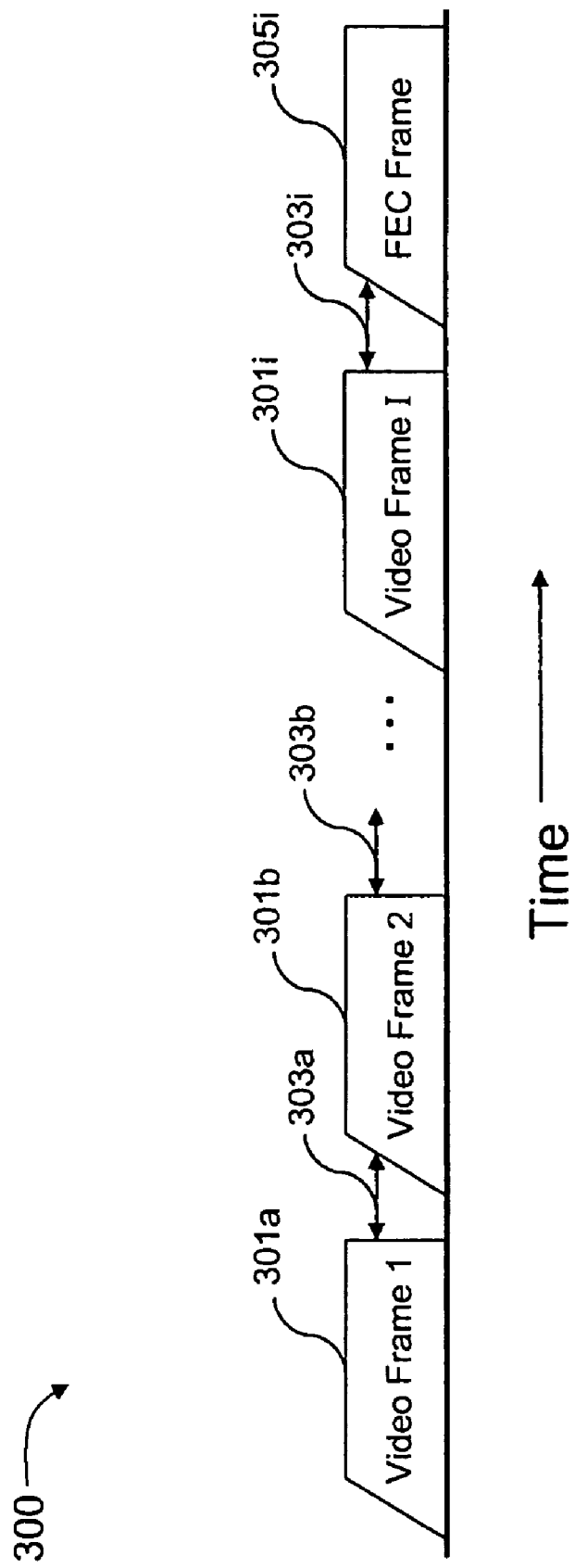
FIG. 3 illustrates an exemplary encoded IPTV stream generated by the running-basis parity check encoder of FIG. 2, according to an embodiment of the present invention.

FIG. 3 illustrates an exemplary encoded IPTV stream 300 generated by running-basis parity check encoder 200, according to an embodiment of the present invention. IPTV stream 300 comprises video frames transmitted over a wireless link, such as wireless link 115 of FIG. 1. In an embodiment, video frames 301a-i are 802.11 frames that contain packets of IP encoded video data. IPTV stream 300 includes spacings 303a-i between each transmitted video frame 301a-i. Spacings 303a-i are variable in length and depend on several factors, including the underlying transmission protocol and channel conditions. Spacings 303a-i may include, for example, the time necessary to transmit/receive a clear to send (CTS), a request to send (RTS), or an acknowledgment (ACK) frame, as well as any time necessary for retransmission of lost packets.

The encoded IPTV stream 300 further includes an additional forward error correction (FEC) frame 305i. As illustrated in FIG. 3, after every i video frames transmitted, an additional forward error correction (FEC) frame 305i is transmitted. The combination of video frames 301a-i and FEC frame 305i represents an encoded IPTV stream. FEC frame 305i may be able to correct errors among packets (i.e., inter-packet), which are encapsulated within video frames 301a-i. For example, FEC frame 305i may be capable of recovering an IP packet that was encapsulated by a lost video frame 301a-i. Alternatively, FEC frame 305i may be able to recover an underlying frame encapsulated by a lost video frame 301a-i, such as an Ethernet frame.

Figure 4:
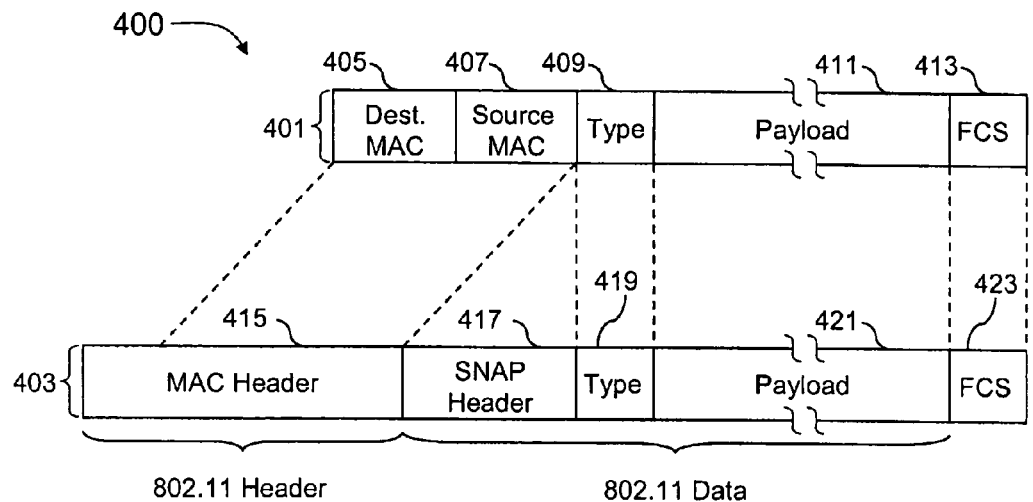
FIG. 4 illustrates an exemplary encapsulation of an Ethernet frame within an IEEE 802.11 packet, according to embodiments of the present invention.

Referring now to FIG. 4. FIG. 4 illustrates an exemplary encapsulation 400 of an Ethernet frame 401 within an 802.11 frame 403. Ethernet frame 401 comprises a destination MAC address 405, a Source MAC address 407, a type code 409, a payload 411, and a frame check field 413. As noted above in FIG. 1, Ethernet may be the underlying communications standard between access network 109 and access point 111. As a result, an IPTV stream received from access network 109 will be received as a series of Ethernet frames. Access point 111 is responsible for formatting the received Ethernet frames into the frame structure specified by the underlying wireless protocols, such as the protocols specified by the 802.11 standards. FIG. 4 illustrates an exemplary encapsulation 400 of Ethernet frame 401 within 802.11 frame 403, which may be performed by access point 111. 802.11 frame 403 comprises MAC header 415, SNAP header 417, type code 419, payload 421, and frame check field 423. In an embodiment, the encapsulation of Ethernet frames 401 within access point 111, may occur on an encoded stream of Ethernet frames, such as encoded stream 213 of FIG. 2.

Without loss of generality, exemplary encapsulation 400 involves copying the destination MAC address 405 and Source MAC address 407 into MAC header 415, and copying type code 409, payload 411 and frame check field 413 into corresponding type code 419, payload 421 and frame check field 423, respectively. SNAP header 417, as well as other fields within MAC header 415, are provided in addition to the data copied from Ethernet frame 401. It will be understood by one skilled in the relevant art(s) that other forms of encapsulation may be used without departing from the scope of the present invention.

Figure 5:
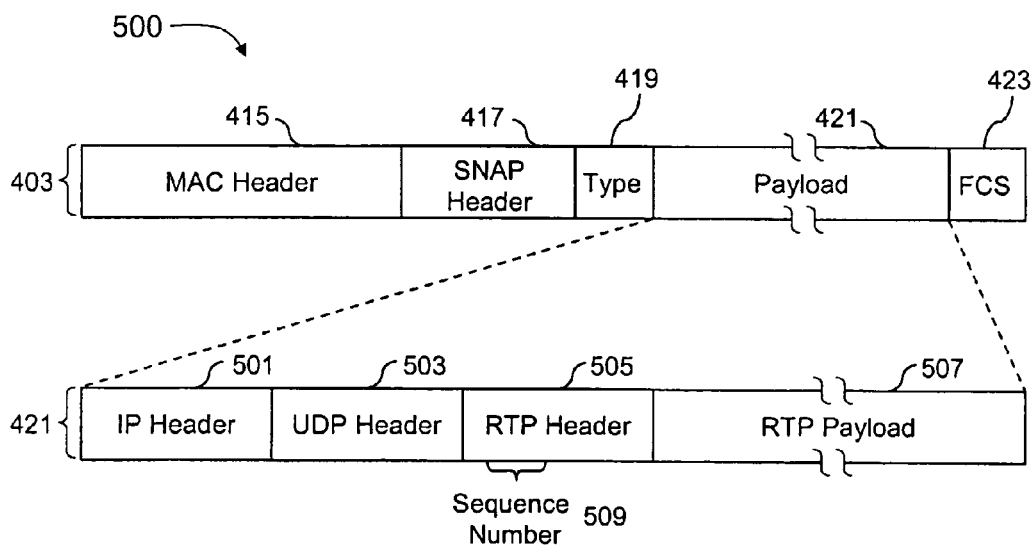
FIG. 5 illustrates a detailed view of an exemplary payload for an 802.11 frame carrying IPTV data, according to an embodiment of the present invention.

FIG. 5 illustrates a detailed view 500 of an exemplary payload 421 for an 802.11 frame 403 carrying IPTV data, according to an embodiment of the present invention. Exemplary payload 421 includes IP header 501, User Datagram Protocol (UDP) header 503, Real-time Protocol (RTP) header 505, and RTP payload 507. As noted earlier, an IPTV stream comprises a video stream that has been segmented and encoded within IP packets, such as payload 421 illustrated in FIG. 5. UDP/RTP is a common transport and application layer protocol combination for delivering delay sensitive data (that may tolerate some loss), such as video, over the internet. It will be understood by one skilled in the relevant art(s) that other transport and application layer protocols may be used without departing from the scope of the present invention.

As further illustrated by FIG. 5, each RTP header 505 contains a sequence number that increases in value by one for each RTP packet transmitted. Sequence number 509 may be used at a receiver to detect the occurrence of a lost packet among a stream of received packets. As mentioned earlier, the ability to infer the position of a lost packet within a stream of received packets may greatly reduce the complexity required to implement a FEC scheme. Running-basis parity check encoder 200 advantageously exploits the erasure type channel formed during real-time multimedia transmissions, such as an IPTV transmission, thereby reducing complexity. In further embodiments, the use of artificial sequence numbers may be employed within the present invention. For example, IP, TCP or UDP packets may be protected in a similar manner by introducing a sequence number within each packet. In addition, sequence numbers may be added within the common MAC pre-pended header of an 802.11 frame.

Figure 6:
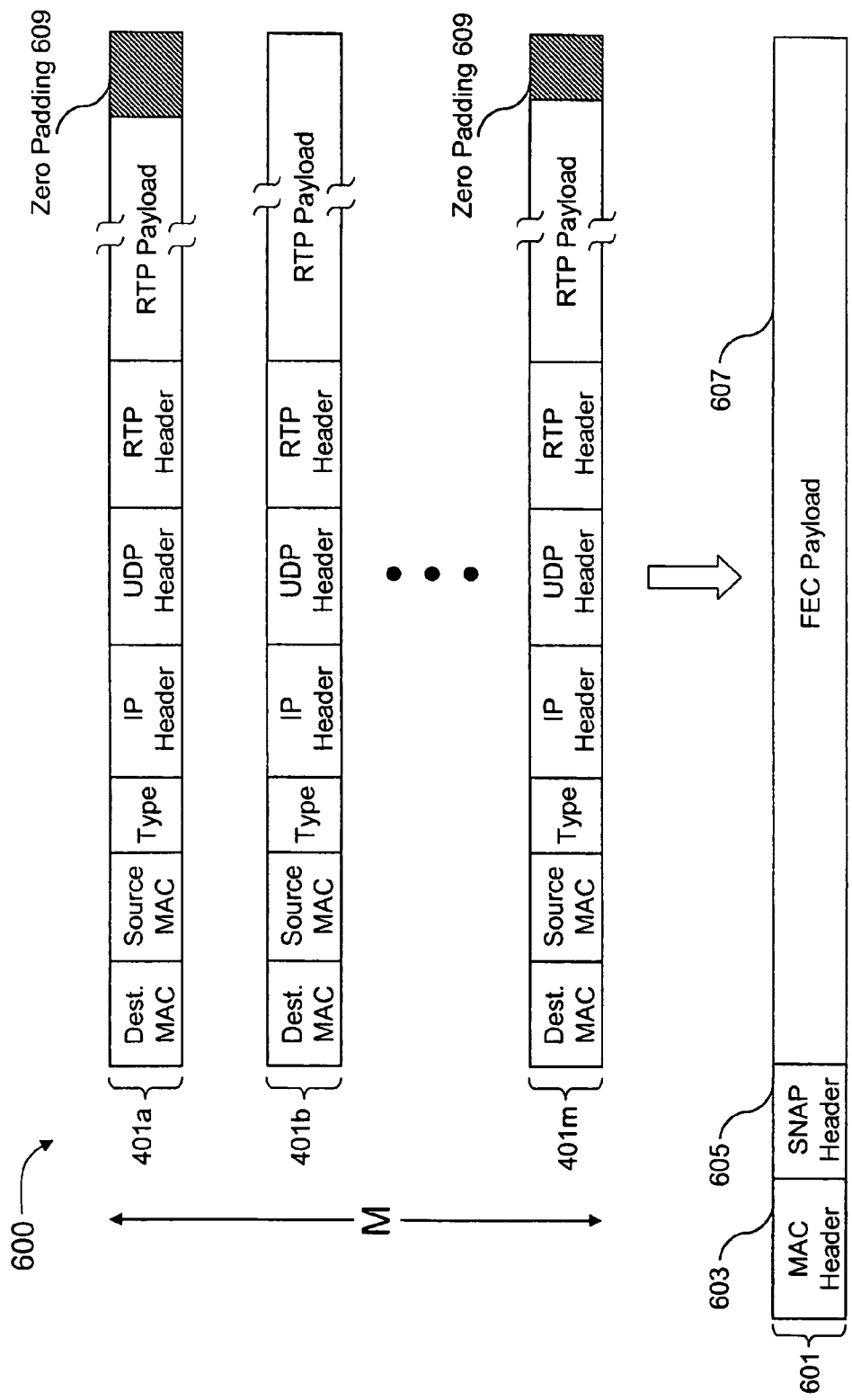
FIG. 6 illustrates an exemplary production of an 802.11 frame carrying FEC data, according to an embodiment of the present invention.

Referring now to FIG. 6. FIG. 6 illustrates exemplary production 600 of an 802.11 frame 601 carrying FEC data, according to an embodiment of the present invention. The 802.11 FEC frame 601 is partially generated from the bitwise XOR of M Ethernet frames 401a-m, as illustrated in FIG. 2. The 802.11 FEC frame 601 comprises MAC header 603, SNAP header 605 and FEC payload 607. In general, FEC payload 607 represents parity check data that may be used to recover any one of the M Ethernet frames 401a-m that may have been lost at a receiver. However, it should be noted that only a single Ethernet frame 401 (i.e., a single IP packet) may be recovered among the M Ethernet frames 401a-m that the FEC payload 607 is influenced by. In the event where more than one Ethernet frame 401 is lost within the M Ethernet frames 401a-m, no recovery may occur using the 802.11 FEC frame 601. Moreover, since the RTP payload within Ethernet frames 401a-m may be variable in length, zero padding 609 may be used to create equal length Ethernet frames 601a-m for accurate generation of FEC payload 607. It should be noted that MAC header 603 may include a new type code to distinguish FEC frames from data frames carrying video. Furthermore, it should be noted that MAC header 603 may additional include a sequence number that is indicative of the frames position within a transmitted stream of frames. Although FIG. 6 illustrates the generation of FEC payload 607 using entire Ethernet frames 401a-m, it will be understood by skilled in the relevant art(s) that any portion thereof of Ethernet frames 401a-m may be used to generate FEC payload 607. For example, the IP packet may be the only portion of Ethernet frame protected by FEC payload 607. In the specific embodiment of FIG. 6, each IP packet consists of an IP header, UDP header, RTP header and RTP payload (along with any additional zero padding 609).

Figure 7:
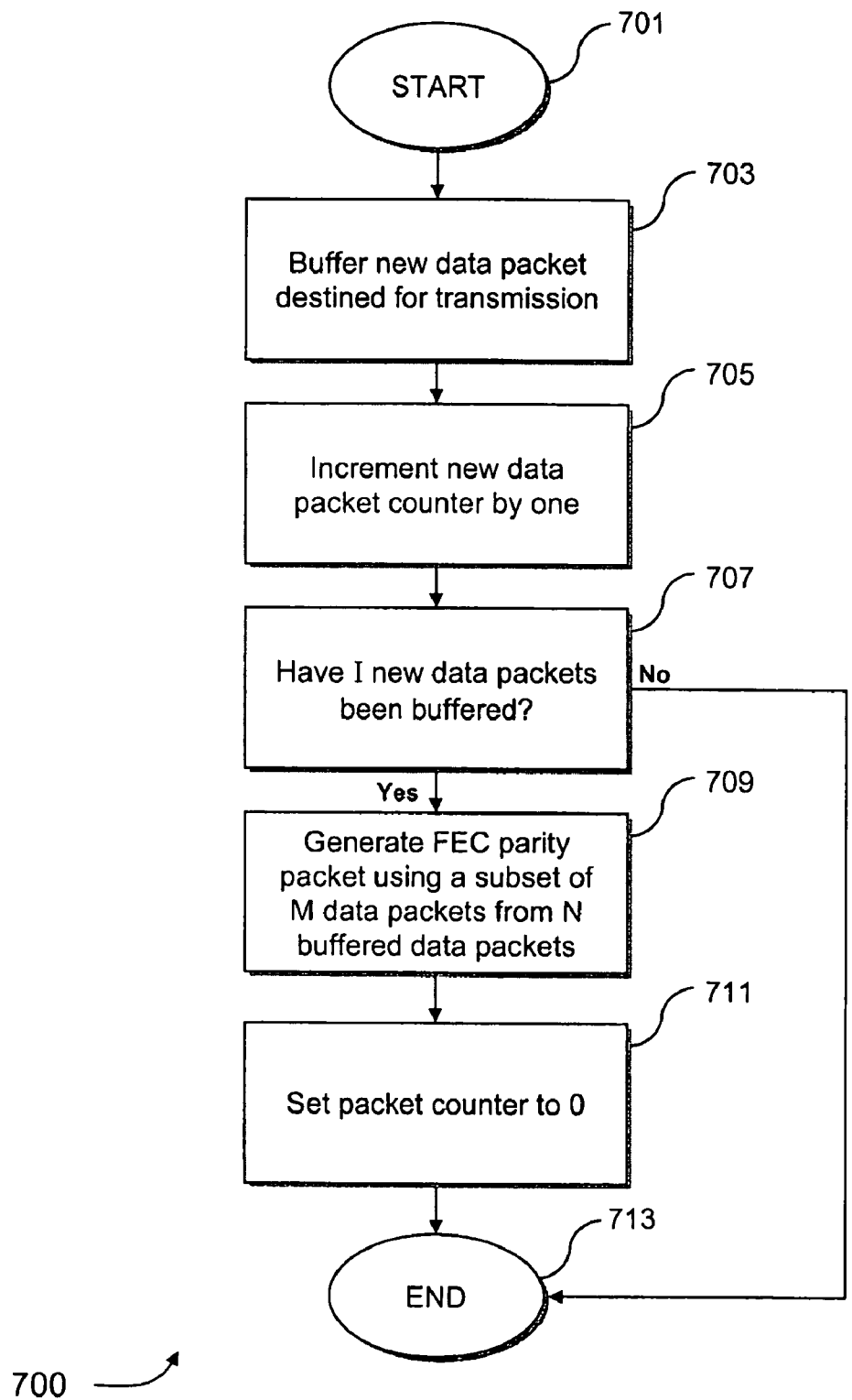
FIG. 7 illustrates an exemplary method for encoding a stream of frames destined for transmission over a packet-based network, according to an embodiment of the present invention.

FIG. 7 illustrates an exemplary method 700 for encoding a stream of frames destined for transmission over a packet-based network, according to an embodiment of the present invention. Method 700 begins at step 701 after a new frame, destined for transmission, has been received. Step 701 transitions to step 703 where the new frame is buffered. After the new frame has been buffered at step 703, method 700 proceeds to step 705 where a frame counter is incremented by one. At step 707, the frame counter is checked to determine if I new frames have been received and buffered. If less than I new frames have been received, method 700 transitions to step 713 and ends until another new frame is received. In the alternative, where I new frames have been received and buffered, method 700 transitions to step 709. At step 709, a FEC payload is generated using a subset of M frames selected from N buffered frames. The FEC payload may be subsequently placed within a stream of the received frames to produce an encoded stream for transmission. After the FEC payload has been generated at step 711, the frame counter is reset and method 700 ends at step 713.

Figure 8:
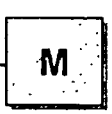
FIG. 8 illustrates an exemplary selection of a subset of M frames used in the generation of a FEC payload, according to an embodiment of the present invention.
Figure 8:
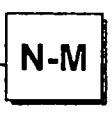

Referring now to FIG. 8. FIG. 8 illustrates an exemplary selection 800 of a subset of M frames, where M=32, used in the generation of a FEC payload. The subset of M frames is selected from N total frames, where N=120. Shaded packets 801 represent the frames included in the FEC payload calculation, and N-M un-shaded packets 803 represent the frames excluded from the FEC payload calculation. In exemplary selection 800, the subset consisting of frames {2, 3, 4, 6, 9, 18, 20, 22, 27, 28, 29, 31, 36, 41, 44, 45, 46, 52, 53, 70, 80, 81, 82, 87, 88, 92, 110, 111, 112, 116, 117, 118} is selected from the total set of 120 frames. In general, the optimal selection of M frames to be used in the generation of a FEC payload from N frames is an NP complete problem and cannot be solved in polynomial time. Consequently, the above subset of 32 frames chosen from a FEC window size of 120, represents an excellent implementation found using a heuristic approach. The above subset may further be implemented using an interleave factor of I, where I=8; that is for every 8 frames buffered (i.e. to be transmitted), one FEC payload is generated. The generation of a FEC payload for every 8 frames to be transmitted roughly decreases available bandwidth for data by 12.5%. Nevertheless, the encoded stream of frames allows for the correction of a very large number of packet errors (PE), as will be explained in the following sections.

It will be understood by one skilled in the relevant arts that different values for N, M and I may be used without departing from the scope of the present invention. In addition, it will be further understood to one skilled in the relevant art(s) that the actual subset of M frames selected from the N buffered frames may be different than disclosed above without departing from the scope of the present invention.

4. Inter-Packet Channel Decoding

Figure 9:
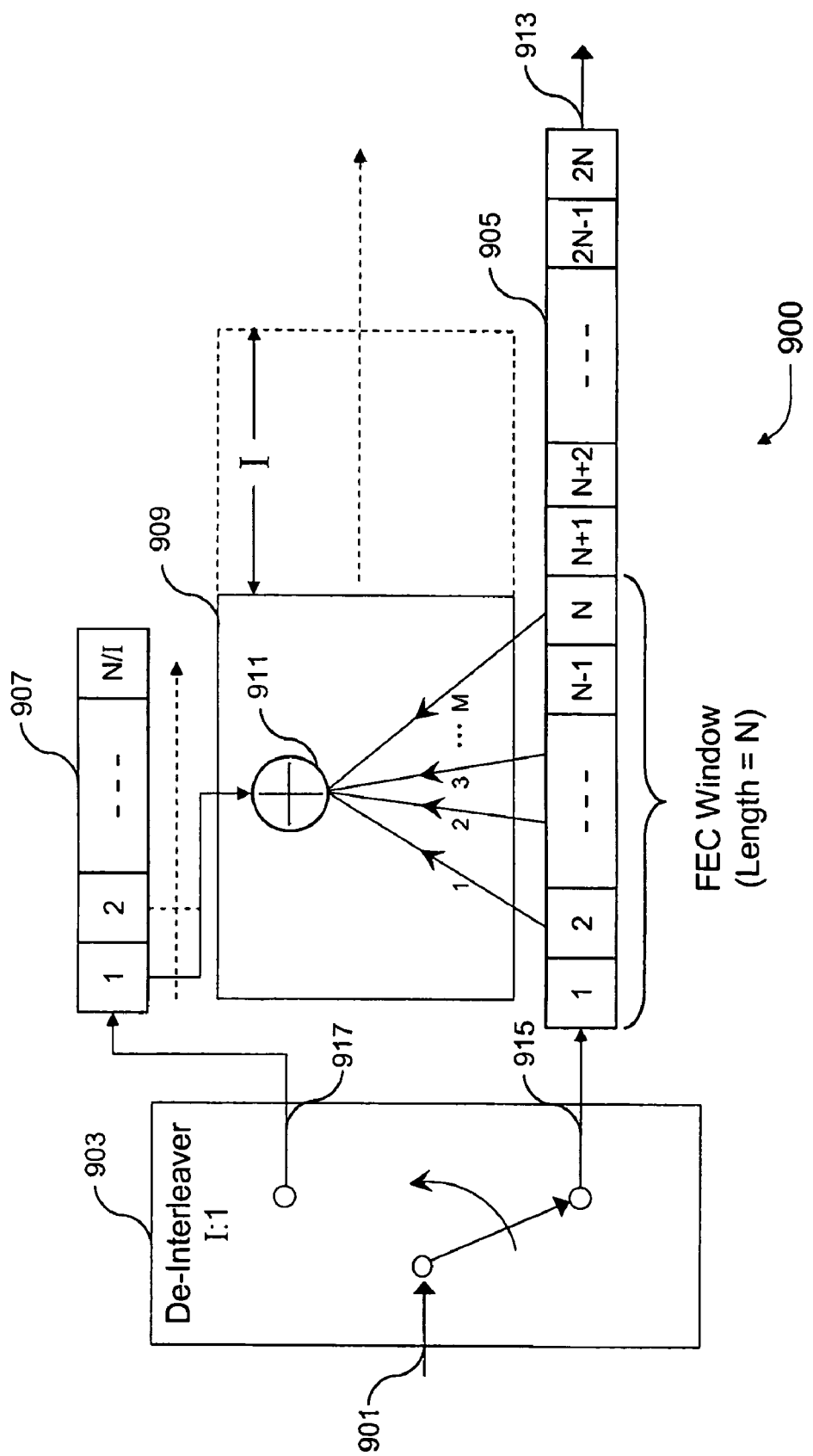
FIG. 9 illustrates an exemplary block diagram of a running-basis parity check decoder for decoding a stream of frames received from a packet-based network, according to an embodiment of the present invention.

FIG. 9 illustrates an exemplary block diagram of a running-basis parity check decoder 900 for decoding a stream of frames 901 received from a packet-based network, according to an embodiment of the present invention. Running-basis parity check decoder 900 may be implemented in hardware, software or any combination thereof. In an embodiment, running-basis parity check decoder 900 may be implemented within wireless station 113 of FIG. 1. Ethernet frames received over wireless link 115, carrying IP video packets, may be decoded by running-basis parity check decoder 900 before being transmitted over network link 107 to receiving node 119. Running-basis parity check decoder 900 allows for lost packets among a stream of received packets (i.e., inter-packet) to be recovered. Running-basis parity check decoder 900 includes de-interleaver 903, frame buffer 905, FEC payload buffer 907, and FEC parity check node 909.

Frame buffer 905, in an embodiment has a frame buffer length of 2 N frames, and receives a stream of Ethernet frames 915 provided by an IPTV source node, such as source node 101 of FIG. 1. In general, the longer the frame buffer length is, the more opportunities there will be for correcting lost packets (assuming FEC payloads are also buffered for longer durations). FEC payload buffer 907, in an embodiment, has a FEC payload buffer length of N/I (where I is the interleave/de-interleave factor used at the encoder/decoder). It should be noted that stream of frames 901 has already been processed by the 802.11 protocol stack at wireless station 113. However, as will be understood by one skilled in the relevant arts the encoding/decoding scheme of the present invention may be implemented before or after packets/frames have been processed by the 802.11 protocol stack. Stream of frames 901 represents the Ethernet frames and FEC payloads which were encapsulated by the 802.11 frames received by wireless station 113.

De-interleaver 903 receives the stream of frames 901 and de-interleaves the FEC payloads and Ethernet frames. The de-interleaved stream of Ethernet frames 915 is coupled to frame buffer 905 and the de-interleaved stream of FEC payloads 917 is coupled to FEC payload buffer 907. De-interleaver 903 de-interleaves a single FEC payload for every I Ethernet frames, matching the interleave rate of the encoder at the transmitter.

As the stream of Ethernet frames 915 is placed within frame buffer 905, packet losses may be inferred. As mentioned earlier, the header of RTP packets within each Ethernet frame contains a sequence number. The sequence number is incremented by one for every RTP packet sent.

Consequently, a lost packet (i.e., a lost Ethernet frame) may be inferred based on the RTP sequence numbers. In the event of a single lost Ethernet frame, among a subset of M Ethernet frames used in the generation of a FEC payload, the lost Ethernet frame may be recovered. The relevant FEC payload (i.e., a FEC payload that has been influenced by the lost Ethernet frame) may be obtained from FEC payload buffer 907 and the subset of M−1 corresponding Ethernet frames may be obtained from frame buffer 905. FEC parity check node 909 may recover the lost Ethernet frame by the bit-wise XOR 911 of the relevant FEC payload and the M−1 corresponding Ethernet frames.

FIG. 9 further illustrates a "sliding" FEC parity check node 909 (illustrated with dashed lines) that may be moved in intervals of length I (where I is the interleave/de-interleave factor), such that FEC parity check node is coupled to the relevant FEC payload and the corresponding M Ethernet frames which were used to generate the FEC payload at the encoder. It should be noted that the "sliding" FEC parity check node 909 is meant to be illustrative of the underlying concept and not limiting in terms of implementation.

As mentioned previously, a single FEC payload stored within FEC payload buffer 907 may be used to recover, at most, a single lost Ethernet frame among the M Ethernet frames used in the FEC payload's generation.

Consequently, in the event two or more Ethernet frames are lost within a subset of M Ethernet frames used in the generation of a particular FEC payload, the lost Ethernet frames are unrecoverable by that particular FEC payload alone. However, since the encoder described in FIG. 2 was operating on a running-basis, each Ethernet frame encoded may have influenced more than one FEC payload. In fact, in certain implementations of the running-basis parity check encoder 200 of FIG. 2, a single Ethernet frame may potentially influence up to M FEC payloads. This running-basis encoding/decoding scheme allows for later received FEC payloads to potentially correct errors (i.e., recover lost Ethernet frames) within the respective subset of M Ethernet frames associated with another FEC payload. In certain situations, this may allow a once unusable FEC payload, such as the case where more than one Ethernet frame has been lost among the M Ethernet frames used in a particular FEC payload's generation, to become usable (i.e., to recover a lost Ethernet frame). A specific example that further illustrates this concept is provided in FIG. 10 described below.

Figure 10:
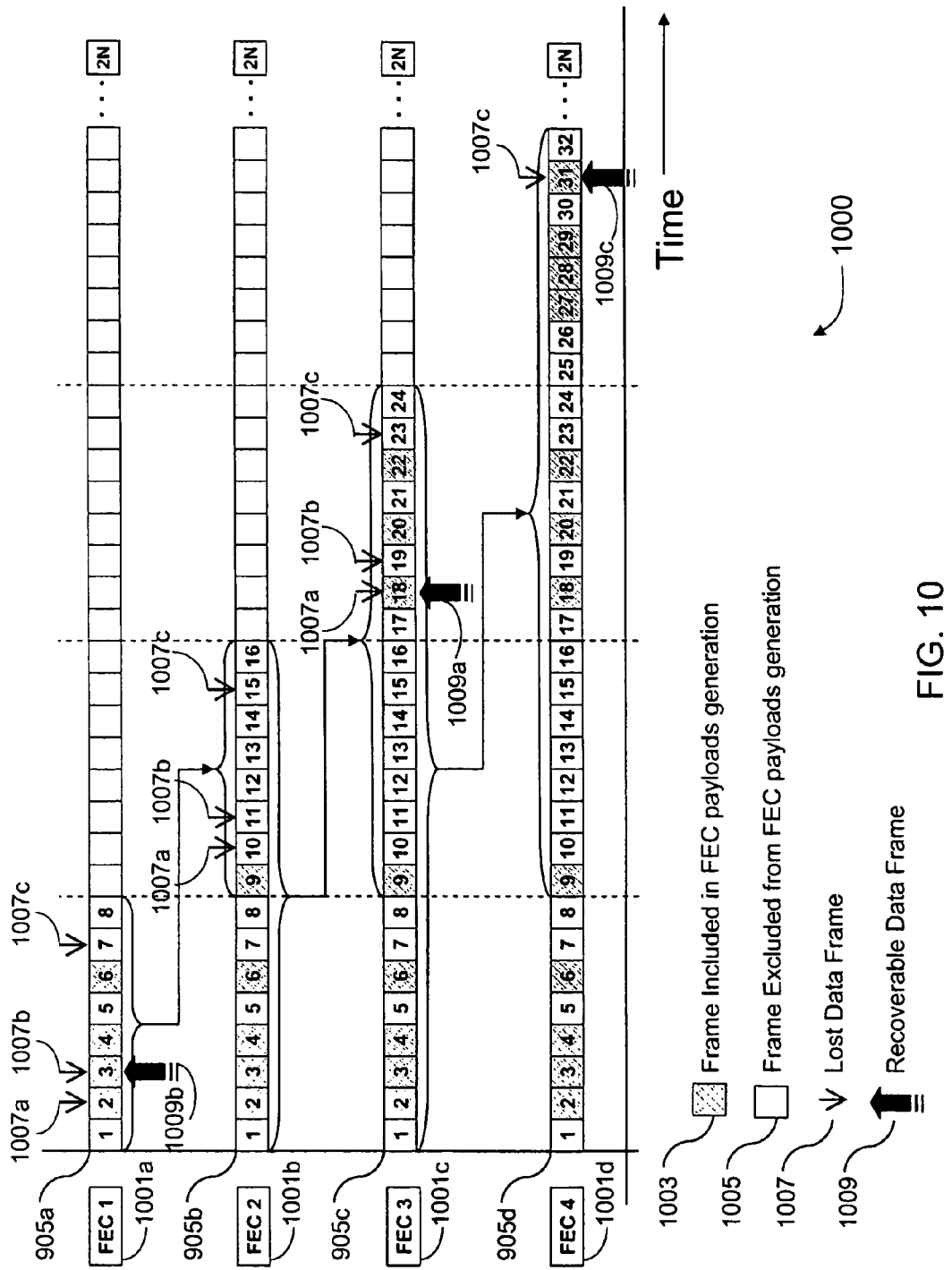
FIG. 10 illustrates an exemplary decoding process 1000 as it occurs over time, according to an embodiment of the present invention.

Referring now to FIG. 10. FIG. 10 illustrates an exemplary decoding process 1000 as it occurs over time, according to an embodiment of the present invention. FIG. 10 illustrates frame buffer 905 of FIG. 9 right after the reception of four FEC payloads 1001a, 1001b, 1001c, and 1001d. Frame buffer instances 905a, 905b, 905c and 905d illustrate the contents of frame buffer 905 right before the reception of each FEC payload 1001a, 1001b, 1001c and 1001d, respectively. As illustrated by FIG. 10, the number of buffered frames within FEC buffer 905 increases by 8 within each of the four equal spaced time periods, implying an exemplary interleave/de-interleave factor of 8 used at the encoder/decoder (i.e., one FEC payload is transmitted/received for every 8 Ethernet frames). It is assumed that frame buffer 905 was initially empty before the first 8 Ethernet frames arrived, i.e., no Ethernet frames were sent until the first 8 Ethernet frames arrived, as illustrated by frame buffer instance 905a.

In the first time period, frame buffer 905 has received and buffered Ethernet frames 1-8, as illustrated by frame buffer instance 905a. Shortly thereafter, first FEC payload 1001a is received. In the second time period illustrated, the first 8 Ethernet frames buffered are shifted to positions 9-16, as illustrated by frame buffer instance 905b and a new set of 8 Ethernet frames are further received and buffered at positions 1-8. Again, shortly after the reception of the second set of 8 Ethernet frames, second FEC payload 1001b is received. This same process continues until the reception of fourth FEC payload 1001d.

Each FEC payload 1001a, 1001b, 1001c and 1001d has been generated from a subset of M Ethernet frames selected from the last N Ethernet frames (that are ideally) received before the FEC payload. For example, FEC payload 1001a has been generated from M Ethernet frames selected from Ethernet frames 1-N stored within frame buffer 905 (although in the specific illustration of FIG. 10 only 8 Ethernet frames have been received at this point). The buffered frames at each frame buffer instance 905a-d that were used to generate the corresponding FEC payload, are illustrated by shaded boxes 1003. For example, Ethernet frames stored at positions 2, 3, 4 and 6 within frame buffer instance 905a, were used in the generation of FEC payload 1001a. FEC payload 1001b was generated using Ethernet frames stored at positions 2, 3, 4, 6 and 9 within frame buffer instance 905b. FEC payload 1001c was generated using Ethernet frames stored at positions 2, 3, 4, 6, 9, 18, 20 and 22 within frame buffer instance 905c. Finally, FEC payload 1001d was generated using Ethernet frames stored at positions 2, 3, 4, 6, 9, 18, 20, 22 27, 28, 29 and 31 within frame buffer instance 905d.

Exemplary decoding process 1000 further illustrates the recovery of 3 lost data frames 1007a, 1007b and 1007c. Each lost frame 1007a, 1007b and 1007c was within the first 8 Ethernet frames received. Ethernet frames at positions 2, 3 and 7 within frame buffer instance 905a correspond to lost Ethernet frames 1007a, 1007b and 1007c. Ethernet frames at positions 2 and 3 were used at the encoder to generate FEC payload 1001a. As noted earlier, a single FEC payload may be used to recover a single lost frame. In this instance, more than one Ethernet frame has been lost within the subset of Ethernet frames used to generate FEC payload 1001a. As a result, lost Ethernet frames 1007a and 1007b are unrecoverable at this point in time. Lost Ethernet frame 1007c at position 7 is further unrecoverable since it is not included within a FEC payload calculation.

At the next frame buffer instance 905b, 8 additional Ethernet frames arrive, and the first 8 Ethernet frames buffered are shifted to positions 9-16 within frame buffer 905. No additional frames have been lost in the newly received Ethernet frames stored at positions 1-8. Second FEC payload 1001b was generated using Ethernet frames stored at positions 2, 3, 4, 6 and 9. None of the original Ethernet frames lost 1007a, 1007b and 1007c (shifted to positions 10, 11, and 15) were used in the generation of second FEC payload 1001b and, as a result, remain unrecoverable at this point.

At next frame buffer instance 905c, 8 additional Ethernet frames arrive, and the first 16 Ethernet frames buffered are shifted to positions 9-24 within frame buffer 905. No additional frames have been lost among the newly received Ethernet frames stored at positions 1-8. Third FEC payload 1001c was generated using Ethernet frames stored at positions 2, 3, 4, 6, 9, 18, 20 and 22. Lost Ethernet frame 1007a, currently at position 18 within frame buffer 905, was used at the encoder to generate FEC payload 1001c. Furthermore, lost Ethernet frame 1007a is the only lost Ethernet frame among the three currently non-recovered frames used in the generation of FEC payload 1001c. Consequently, FEC payload 1001c may be used to recover lost Ethernet frame 1007a. Once FEC payload 1001c has been used to recover an Ethernet frame, it may no longer be used in the correction of another Ethernet frame and is subsequently consumed (i.e., discarded). The recovery of lost Ethernet frame 1007a subsequently allows previously unusable FEC payload 1001a to be usable. Lost Ethernet frame 1007b may now be recovered using FEC payload 1001a, leaving a single remaining lost Ethernet frame 1007c.

At this point, lost Ethernet frame 1007c has not been correctable by any of the received FEC payloads 1001a-c. However, FEC payload 1001d received in the final illustrated time period of FIG. 10, has been generated using lost Ethernet frame 1001d. In addition no further Ethernet frames have been lost within the final time period. Consequently, FEC payload 1001d may be used to recover final lost Ethernet frame 1007c.

Figure 11:
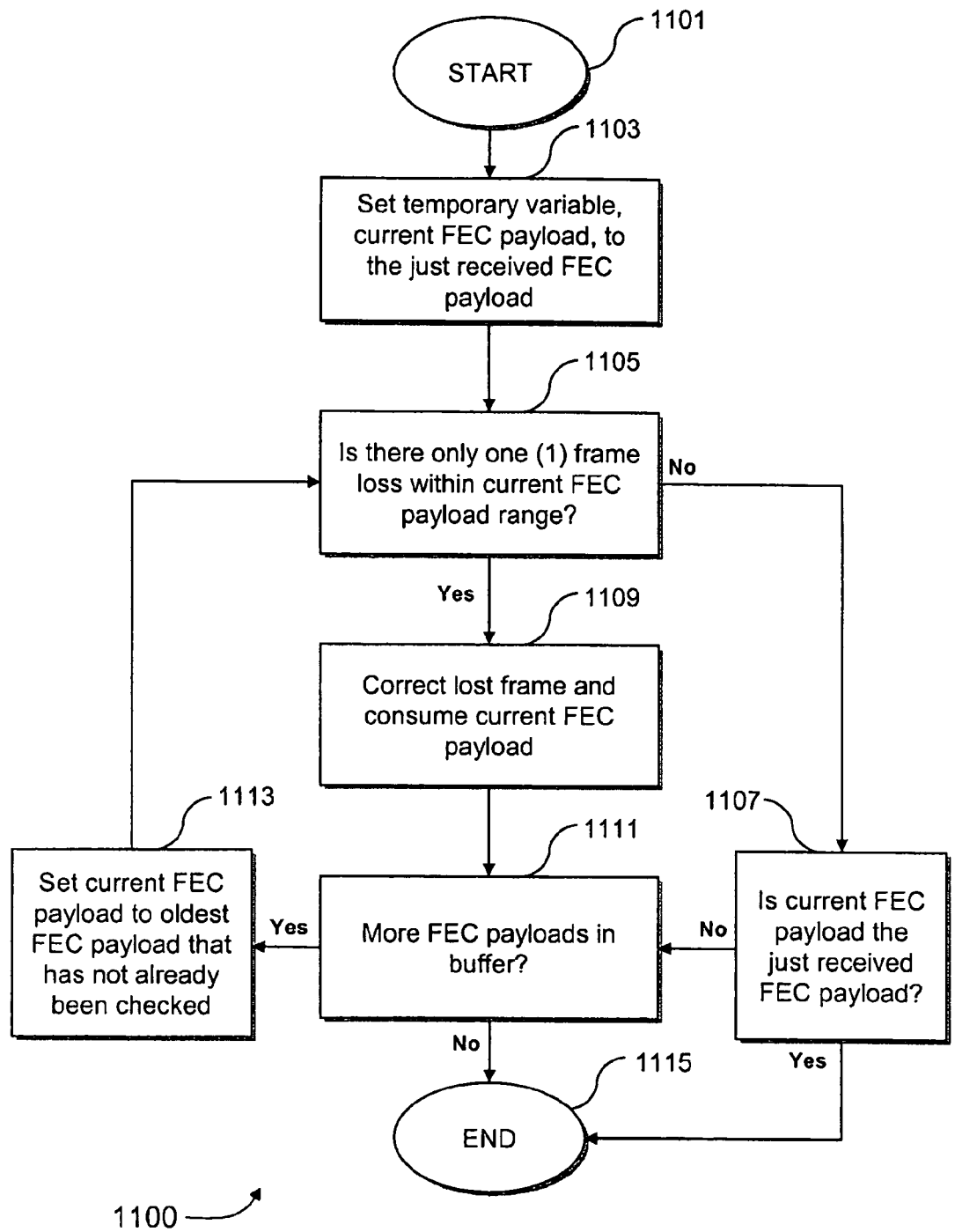
FIG. 11 illustrates an exemplary method 1100 for decoding an stream of encoded frames, according to an embodiment of the present invention.

Referring now to FIG. 11. FIG. 11 illustrates an exemplary method 1100 for decoding a stream of encoded frames, according to an embodiment of the present invention. Decoding method 1100 begins at step 1101 after a new FEC payload has been received and at least one frame loss exists among a received stream of frames. Method 1100 immediately transitions from step 1101 to step 1103. At step 1103, a temporary variable, current FEC payload, is set equal to the just received FEC payload and method 1100 transitions to step 1105. At step 1105, a determination is made whether a single frame loss is within the current FEC payload range (i.e., a single frame has been lost among the frames used to generate current FEC payload). If no errors or more than one error is within the current FEC payload, method 1100 transitions to step 1107. At step 1107, a determination is made whether the current FEC payload is the just received FEC payload. If the current FEC payload is the just received FEC payload, method 1100 transitions to step 1115 and ends. If the just received FEC payload does not recover any errors within a current buffer of received frames, no additional opportunities to use previously received FEC payloads may be present. Consequently, step 1107 eliminates needless iterations over previously received FEC payloads for lost frame recovery.

In the alternative, when the current FEC payload is not the just received FEC payload, method 1100 transitions from step 1107 to step 1111. At step 1111, a FEC payload buffer is checked for any remaining FEC payloads that have not been currently checked. If there exists remaining FEC payloads that have not been checked, method 1100 transitions to step 1113. At step 1113, the current FEC packet is set equal to the oldest remaining FEC payload within the FEC payload buffer that has yet to be checked. The oldest existing errors may be recovered first since they will expire (i.e., be pushed out of the buffer and into the upper processing layers) first. Step 1113 transitions back to step 1105 and the process continues. In the case where a single error is within the current FEC payload at step 1105, method 1100 transitions to step 1109 and the lost frame is recovered. Step 1109 transitions to step 1111 and method 1100 continues to check remaining FEC payloads within the FEC payload buffer. If no further FEC payloads remain to be checked, method 1100 transitions from step 1111 and ends at step 1115.

It will be understood by one skilled in the relevant art(s) that other methods for generating FEC payloads may be used without departing from the scope of the present invention. For example, alternative to the use of the XOR operation in generating a FEC payload, the packets/frames to be protected/encoded by the FEC payload may be summed. The resulting sum may represent a checksum that may be used at a decoder to correct for a lost packet/frame. In general, any method, such as a mathematical operation, may be used to produce a FEC payload that allows for the recovery of a single lost packet/frame among the packets/frames that were used in the production of the FEC payload.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An encoder for encoding a stream of packets for transmission over a channel, comprising:
   a buffer configured to store a sequence of N packets from the stream of packets, wherein N is an integer value;
   a forward error correction (FEC) packet generator configured to produce one FEC packet for transmission over the channel, after each new set of I packets from the stream of packets are shifted into the sequence of N packets stored in the buffer, by performing a mathematical operation on only M packets selected from the N packets, wherein I and M are integer values that are less than N; and
   an interleaver configured to interleave the stream of packets with the one FEC packet produced by the FEC packet generator after each new set of I packets from the stream of packets are shifted into the sequence of N packets stored in the buffer to produce an encoded stream of packets.

2. The encoder of claim 1, wherein the mathematical operation performed on the M packets is a bit-wise XOR.

3. The encoder of claim 1, wherein the mathematical operation performed on the M packets is a checksum.

4. The encoder of claim 1, wherein the encoded stream of packets is carrying video data.

5. The encoder of claim 4, wherein the video data has been segmented and encoded within Internet Protocol (IP) packets.

6. The encoder of claim 1, wherein each of the packets in the encoded stream includes a sequence number that is used to detect the occurrence of a lost packet.

7. The encoder of claim 1, wherein I is 8.

8. The encoder of claim 1, wherein N is 120 and M is 32.

9. The encoder of claim 8, wherein the M packets comprise packets 2, 3, 4, 6, 9, 18, 20, 22, 27, 28, 29, 31, 36, 41, 44, 45, 46, 52, 53, 70, 80, 81, 82, 87, 88, 92, 110, 111, 112, 116, 117, 118 within the sequence of N packets.

10. The encoder of claim 1, wherein the encoded stream of packets is transmitted over a wireless channel.

11. The encoder of claim 10, wherein the encoded stream of packets is transmitted according to an IEEE 802.11 standard.

12. A method for encoding a stream of packets for transmission over a channel, comprising:
   (a) storing a sequence of N packets from the stream of packets in a buffer, wherein N is an integer value;
   (b) generating one forward error correction (FEC) packet for transmission over the channel, after each new set of I packets from the stream of packets are shifted into the sequence of N packets stored in the buffer, by performing a mathematical operation on of M packets selected from the N packets, wherein I and M are integer values that are less than N; and
   (c) interleaving the stream of packets with the FEC packets generated in step (b) to produce an encoded stream of packets.

13. The method of claim 12, wherein the mathematical operation performed on the M packets is a bit-wise XOR.

14. The method of claim 12, wherein the mathematical operation performed on the M packets is a checksum.

15. The method of claim 12, wherein the encoded stream of packets is carrying video data.

16. The method of claim 15, wherein the video data has been segmented and encoded within Internet Protocol (IP) packets.

17. The method of claim 12, wherein each of the packets in the encoded stream includes a sequence number that is used to detect the occurrence of a lost packet.

18. The method of claim 12, wherein I is 8.

19. The method of claim 12, wherein N is 120 and M is 32.

20. The method of claim 19, wherein the M packets comprise packets 2, 3, 4, 6, 9, 18, 20, 22, 27, 28, 29, 31, 36, 41, 44, 45, 46, 52, 53, 70, 80, 81, 82, 87, 88, 92, 110, 111, 112, 116, 117, 118 within the sequence of N packets.

21. The method of claim 12, further comprising:
   (d) transmitting the encoded stream of packets over a wireless channel.

22. The method of claim 21, wherein the encoded stream of packets is transmitted according to an IEEE 802.11 standard.

23. A decoder for decoding a stream of packets received over a channel, comprising:
   a buffer configured to store data packets received over the channel; and
   a forward error correction (FEC) check node configured to recover a lost data packet using M−1 of the data packets stored in the buffer and a current forward error correction (FEC) packet received over the channel, wherein the current FEC packet was generated using the M−1 data packets and the lost data packet;
   wherein recovery of the lost data packet enables a previous FEC packet, received before the current FEC packet over the channel, to be used by the FEC check node to recover an additional lost data packet among the data packets received over the channel.

24. The decoder of claim 23, wherein the FEC check node performs a mathematical operation on the M−1 data packets and the current FEC packet to recover the lost data packet.

25. The decoder of claim 24, wherein the mathematical operation performed is a bit-wise XOR.

26. The decoder of claim 24, wherein the mathematical operation performed is a checksum.

27. The decoder of claim 23, wherein the current FEC packet is consumed after recovering the lost data packet.

28. The encoder of claim 23, wherein each of the data packets received over the channel include a sequence number that is used to detect the occurrence of the lost data packet.

29. The decoder of claim 23, further comprising a de-interleaver for de-interleaving the current FEC packet from the data packets received over the channel.

30. The decoder of claim 23, wherein the channel is a wireless channel.

31. The decoder of claim 30, wherein the data packets are received over the wireless channel in accordance with an IEEE 802.11 standard.

32. A method for decoding a stream of packets received over a channel, comprising:
   (a) storing data packets received over the channel in a buffer;
   (b) recovering a lost data packet using M−1 of the data packets stored in the buffer and a current forward error correction (FEC) packet received over the channel, wherein the current FEC packet was generated using the M−1 data packets and the lost data packet; and
   (c) checking whether recovery of the lost data packet enables a previous FEC packet, received before the current FEC packet over the channel, to be used to recover an additional lost data packet among the data packets received over the channel.

33. The method of claim 32, wherein step (b) comprises:
   performing a mathematical operation on the M−1 data packets and the current FEC packet to recover the lost data packet.

34. The method of claim 33, wherein the mathematical operation performed is a bit-wise XOR.

35. The method of claim 33, wherein the mathematical operation performed is a checksum.

36. The method of claim 32, wherein the current FEC packet is consumed after recovering the lost data packet.

37. The method of claim 32, wherein the channel is a wireless channel.

38. The method of claim 37, wherein the data packets are received over the wireless channel in accordance with an IEEE 802.11 standard.

* * * * *

UNITED STATES PATENT AND TRADEMARK OFFICE
CERTIFICATE OF CORRECTION

| | |
|---|---|
| PATENT NO. | : 8,201,057 B2 |
| APPLICATION NO. | : 12/285929 |
| DATED | : June 12, 2012 |
| INVENTOR(S) | : Yasantha N. Rajakarunanayake |

It is certified that error appears in the above-identified patent and that said Letters Patent is hereby corrected as shown below:

Column 13, Line 19, please replace "on of M packets" with --on M packets--.

Signed and Sealed this
Thirty-first Day of July, 2012

David J. Kappos
*Director of the United States Patent and Trademark Office*